United States Patent
Larson et al.

(10) Patent No.: US 11,061,100 B2
(45) Date of Patent: Jul. 13, 2021

(54) SYSTEM FOR CONTINUOUS CALIBRATION OF HALL SENSORS

(71) Applicant: TEXAS INSTRUMENTS INCORPORATED, Dallas, TX (US)

(72) Inventors: Tony Ray Larson, Tucson, AZ (US); Dimitar Trifonov, Vail, AZ (US); Chao-Hsiuan Tsay, Tucson, AZ (US); Partha Sarathi Basu, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 138 days.

(21) Appl. No.: 16/576,963

(22) Filed: Sep. 20, 2019

(65) Prior Publication Data

US 2020/0393529 A1    Dec. 17, 2020

Related U.S. Application Data (60) Provisional application No. 62/860,294, filed on Jun. 12, 2019.

(51) Int. Cl.
*G01R 35/00* (2006.01)
*G01R 15/20* (2006.01)
(Continued)

(52) U.S. Cl.
CPC ......... *G01R 35/007* (2013.01); *G01R 15/202* (2013.01); *G01R 33/07* (2013.01); *H03M 1/124* (2013.01)

(58) Field of Classification Search
CPC .... G01R 35/007; G01R 15/202; G01R 33/07; G01R 33/0035; G01R 33/0082; G01R 33/0017; H03M 1/124
(Continued)

(56) References Cited

U.S. PATENT DOCUMENTS 8,203,329 B2    6/2012  Hohe
8,680,846 B2 *  3/2014  Cesaretti ............ G01R 33/0017
                                              324/202
(Continued)

FOREIGN PATENT DOCUMENTS

WO    2004021251    11/2004
WO    2018059796     4/2018

OTHER PUBLICATIONS

M. Kayal et al. "Automatic Calibration of Hall Sensor Microsystems." Microelectronics Journal 37, 2006 1569-1575 (7 pages).
(Continued)

*Primary Examiner* — Tung X Nguyen
*Assistant Examiner* — Robert P Alejnikov, Jr.
(74) *Attorney, Agent, or Firm* — John R. Pessetto; Charles A. Brill; Frank D. Cimino (57) ABSTRACT

A system comprises a calibration current generator, which provides a calibration current to a first and a second Hall channel, and a bias current generator, which determines a difference between a calibration signal from the Hall channels and a threshold and adjusts a biasing current for the Hall channels based on the difference. In some embodiments, the bias current generator comprises a subtractor coupled to an ADC and a controller coupled between the ADC and a DAC. The subtractor obtains a first and a second signal from the first and second Hall channels, respectively, and subtracts the first from the second to obtain the calibration signal. The controller determines the difference between a sampled signal from the ADC and the threshold and an adjustment to the biasing current based on the difference. The DAC adjusts the biasing current based on a control signal from the controller indicating the adjustment.

22 Claims, 7 Drawing Sheets (51) Int. Cl.
*G01R 33/07* (2006.01)
*H03M 1/12* (2006.01)

(58) Field of Classification Search
USPC .......................................................... 324/202
See application file for complete search history.

(56) References Cited

U.S. PATENT DOCUMENTS

| | | | |
|---|---|---|---|
| 9,551,762 B1* | 1/2017 | Cesaretti | G01R 33/07 |
| 2005/0073293 A1* | 4/2005 | Hastings | G01R 15/202 |
| | | | 324/117 H |
| 2008/0238410 A1* | 10/2008 | Charlier | G01R 33/0035 |
| | | | 324/202 |
| 2009/0051421 A1 | 2/2009 | Mathe | |
| 2009/0212765 A1 | 8/2009 | Doogue | |
| 2010/0134101 A1* | 6/2010 | Riva | G01R 33/07 |
| | | | 324/251 |
| 2012/0016614 A1* | 1/2012 | Hohe | G01R 33/075 |
| | | | 702/85 |
| 2012/0229204 A1 | 9/2012 | Han | |
| 2014/0163911 A1* | 6/2014 | Rohrer | G01R 33/0029 |
| | | | 702/64 |
| 2015/0301149 A1* | 10/2015 | Cesaretti | G01R 35/005 |
| | | | 324/202 |
| 2016/0252599 A1* | 9/2016 | Motz | G01R 33/075 |
| | | | 324/251 |
| 2017/0016965 A1* | 1/2017 | Chaware | G01R 33/0017 |
| 2017/0322051 A1* | 11/2017 | Nobira | G01D 5/145 |
| 2018/0011140 A1 | 1/2018 | Chaware | |
| 2019/0154737 A1* | 5/2019 | Nobira | G01R 15/20 |

OTHER PUBLICATIONS

International Search Report in corresponding PCT Application PCT/US2020/037397, dated Nov. 12, 2020 (2 pages).
International Search Report in corresponding PCT Application PCT/US2020/038338, dated Sep. 10, 2020 (2 pages).

* cited by examiner

SYSTEM FOR CONTINUOUS CALIBRATION OF HALL SENSORS

RELATED APPLICATION

This application claims priority to U.S. Provisional Application No. 62/860,294 filed Jun. 12, 2019, which is hereby incorporated by reference.

BACKGROUND

Hall-effect magnetic field sensors, also called Hall sensors, are solid-state magnetic sensor devices that can be used to measure magnetic fields or to indirectly measure currents by the magnetic fields they produce, such as very large currents on the order of tens of amperes (Amps). Applications for Hall sensors often require high accuracy measurements, but Hall sensors are known to suffer from variation and drift in sensitivity with process variations, temperature, package stress, biasing current, device age, and the like. Further, the signal level of Hall sensors is relatively small, making them sensitive to their own thermal noise and the noise of other components on a semiconductor die including the Hall sensors.

Closed-loop calibration systems apply a known magnetic field to the Hall sensor, for example by passing a known temperature-insensitive current through a drift compensation coil or other suitable trace near the sensor, and adjust the Hall sensor's sensitivity based on the difference between the measured sensor output and an expected sensor output. However, calibration can only be performed when the Hall sensor is not in use, as the calibration signal can interfere with the primary signal representing the magnetic field, necessitating infrequent calibration or periodic calibration that disrupts the primary signal.

The magnetic field to be measured or the current to be measured by the magnetic field it produces can influence the operating conditions for the Hall sensor, such that periodic calibration without the current or magnetic field will not accurately account for the sensor's operating conditions. For example, a 10 Amp current causes its trace to heat up, increasing the temperature of the Hall sensor and varying its sensitivity. In addition, disruptions in the primary signal can be unacceptable in applications such as an emergency shutdown system in which the Hall sensor indirectly measures a very large current and triggers emergency shutdown in response to the current increasing above an acceptable safety limit.

Some closed-loop calibration systems implement continuous calibration using a secondary Hall sensor through which to send the calibration signal. The secondary channel does not influence the primary signal and allows near real-time response to changes in the Hall sensors' environmental and operating conditions. Mismatches between the primary and the secondary Hall sensors and their corresponding channels can introduce error into the calibrations though, undercutting the advantages offered by continuous calibration through a secondary Hall sensor.

SUMMARY

In one example, a system comprises a calibration current generator and a bias current generator. The calibration current generator provides a calibration current to a first Hall channel and a second Hall channel. The bias current generator obtains a calibration signal from the first and the second Hall channels and determines a difference between the calibration signal and a threshold. The bias current generator adjusts a biasing current for the first and the second Hall channels based on the difference.

In some examples, the calibration current generator comprises a voltage source, a current generator coupled to the voltage source, and a chopper circuit. The voltage source provides a reference voltage to the current generator, which generates the calibration current and provides it to the chopper circuit. The chopper circuit provides the calibration current to the first and the second Hall channels via a first current path or a second current path. The voltage source can be a bandgap voltage reference circuit, and the current generator can be a resistor. The calibration current generator can include a trimming circuit for trimming the calibration current.

In some examples, the bias current generator comprises a subtractor circuit, an analog-to-digital converter (ADC) coupled to the subtractor circuit, a controller coupled to the ADC, and a digital-to-analog converter (DAC) coupled to the controller. The subtractor circuit obtains a first signal from the first Hall channel and a second signal from the second Hall channel and subtracts the first signal from the second signal to obtain the calibration signal. The ADC samples the analog calibration signal to obtain a sampled, digital, calibration signal. The ADC can integrate the calibration signal over a period of time to obtain the sampled signal. When a current generator in the calibration current generator comprises a resistor, a reference voltage for the ADC can be taken across the resistor.

The controller determines the difference between the sampled signal and the threshold. The controller can average the sampled signal with a number of prior sampled signals to obtain an averaged signal and determine the difference between the averaged signal and the threshold. The controller determines an adjustment to the biasing current based on the difference and generates a control signal based on the determined adjustment. When the calibration current generator includes a chopper circuit, the controller can provide a clock signal to the chopper circuit, and the chopper circuit alternates between the first current path and the second current path based on the clock signal. The DAC adjusts the biasing current based on the control signal.

In some examples, the bias current generator comprises a subtractor circuit, a differential amplifier coupled to subtractor circuit, a filter coupled to the differential amplifier, and a current generator coupled to the filter. The subtractor circuit obtains a first signal from the first Hall channel and a second signal from the second Hall channel and subtracts the first signal from the second signal to obtain the calibration signal. The differential amplifier receives the calibration signal at a positive input terminal and the threshold at the negative input terminal, and outputs a difference between the calibration signal and the threshold. The current generator adjusts the biasing current based on the filtered difference.

In some examples, the system includes the first and the second Hall channels, which are coupled to a first amplifier and a second amplifier, respectively. The first Hall channel comprises a first Hall device having a first drift compensation coil with a first winding direction on top of a first Hall sensor. The second Hall channel comprises a second Hall device having a second drift compensation coil with a second winding direction on top of a second Hall sensor. The second winding direction is opposite the first winding direction. The first and the second Hall devices are matched. A gain of the first Hall channel and a gain of the second Hall channel are substantially equal, and a gain of the first amplifier and a gain of the second amplifier are substantially equal. The first and the second Hall channels are oriented such that the first and the second Hall channels respond substantially the same to a magnetic field.

BRIEF DESCRIPTION OF THE DRAWINGS

For a detailed description of various examples, reference will now be made to the accompanying drawings in which.

DETAILED DESCRIPTION

The disclosed calibration systems implement continuous calibration of associated Hall sensors using two Hall channels with opposite drift compensation coil windings, such that the calibration signal from one Hall channel experiences a different polarity than the calibration signal from the other Hall channel. The different polarities cause the calibration signals to combine linearly with the primary signal while remaining orthogonal to it and without interfering with it. Thus, the disclosed calibration systems are able to continuously calibrate the Hall sensors and account for changes in environmental and operating conditions due to the magnetic field to be measured and a current generating it. The combined signal including both the calibration signal and the primary signal is provided to and modified by the same components, such that any errors introduced by the primary signal path are reflected in the calibration signal as well as the primary signal.

The first and the second Hall channels are arranged such that both experience substantially the same magnetic field, both have substantially matched Hall sensor devices, and both have substantially the same gains. Amplifiers coupled to the first and the second Hall channels have substantially the same gains as well, such that the calibration signal is easily removed from the primary signal for signal processing and the calibration signal is easily isolated for comparison with an expected value of the calibration signal.

A calibration current generator for the drift compensation coils in the first and the second Hall channels includes a voltage source, a current generator, and a chopper circuit. The voltage source, which can be a bandgap voltage reference circuit, is coupled to the current generator and generates a reference voltage. The current generator comprises a resistor, and outputs a calibration current for the first and second Hall channels. The chopper circuit averages any mismatch between the first and second Hall channels and the amplifiers coupled to the first and second Hall channels by chopping the calibration current.

An example bias current generator for the calibration system includes a subtractor circuit, an analog-to-digital converter (ADC) coupled to the subtractor circuit, a controller coupled to the ADC, and a digital-to-analog converter (DAC) coupled to the controller. The subtractor circuit subtracts an output signal from the first amplifier from an output signal from the second amplifier to isolate the calibration signal. The ADC samples the calibration signal, and in some implementations integrates the calibration signal over a period of time to generate the sampled calibration signal. The controller compares the sampled calibration signal to a threshold representing the expected value of the calibration signal, and determines an adjustment to the biasing current based on the comparison. In some examples, the controller averages the sampled calibration signal with a number of prior sampled calibration signal values, effectively filtering the calibration signal. The DAC adjust or maintains the biasing current based on the adjustment from the controller.

Another example bias current generator includes a subtractor circuit coupled to a positive input terminal of a differential amplifier, the differential amplifier, a filter, and a current generator. A negative input terminal of the differential amplifier receives the threshold representing the expected value of the calibration signal. The differential amplifier outputs a difference between the actual and expected values of the calibration signal, which is filtered and then provided to the current generator. The current generator adjusts or maintains the biasing current based on the filtered difference.

Figure 1:
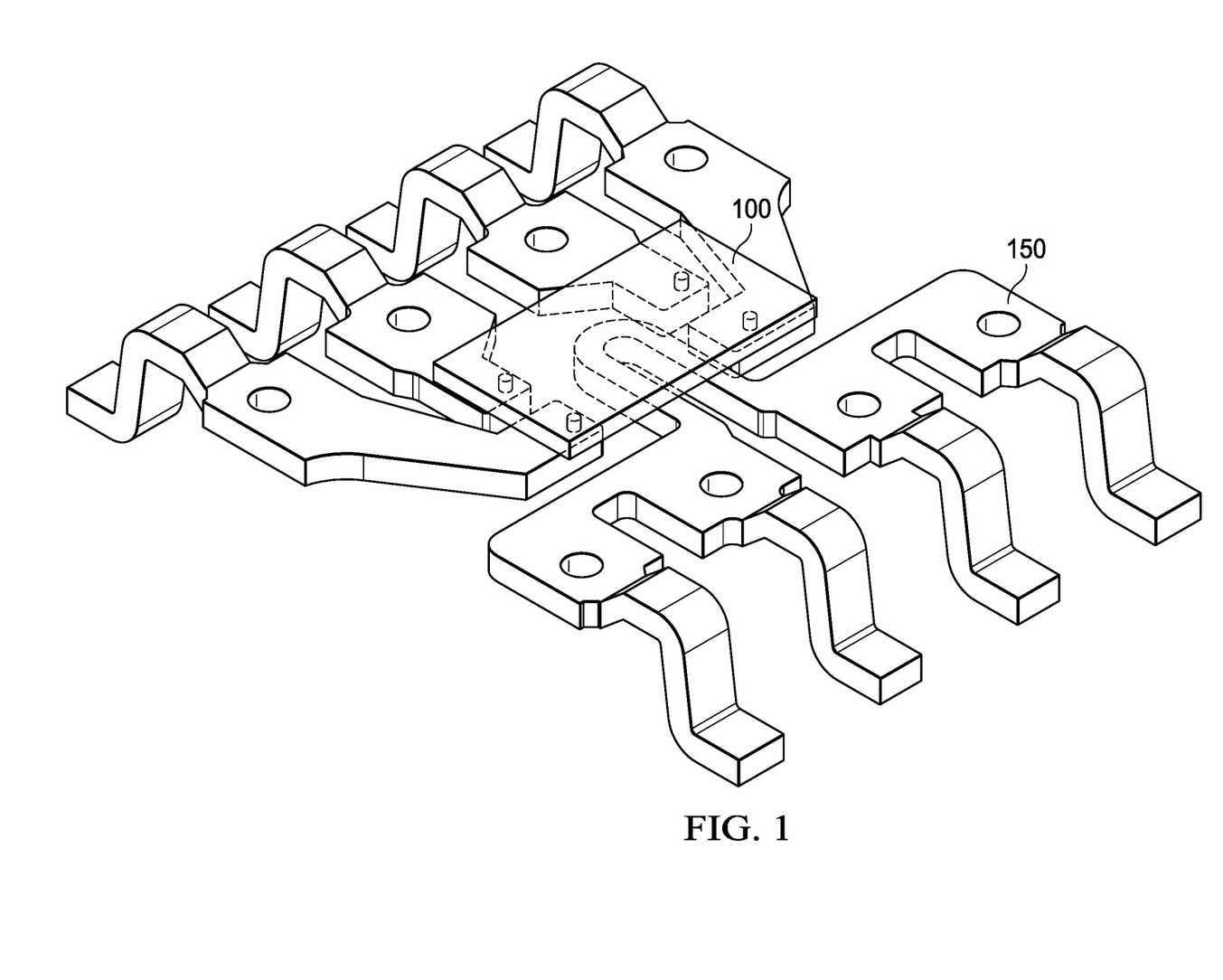
FIG. 1 illustrates an example arrangement of a magnetic sensor system over a current conductor.

FIG. 1 illustrates an example arrangement for a semiconductor die 100 including a magnetic sensor system over a current conductor 150. The semiconductor die 100 is placed on top of horseshoe-shaped current conductor 150, and arranged such that Hall sensors in the magnetic sensor system are centered inside the horseshoe-shaped current conductor 150, ensuring each Hall sensor experiences substantially the same magnetic field generated by current through current conductor 150.

Figure 2:
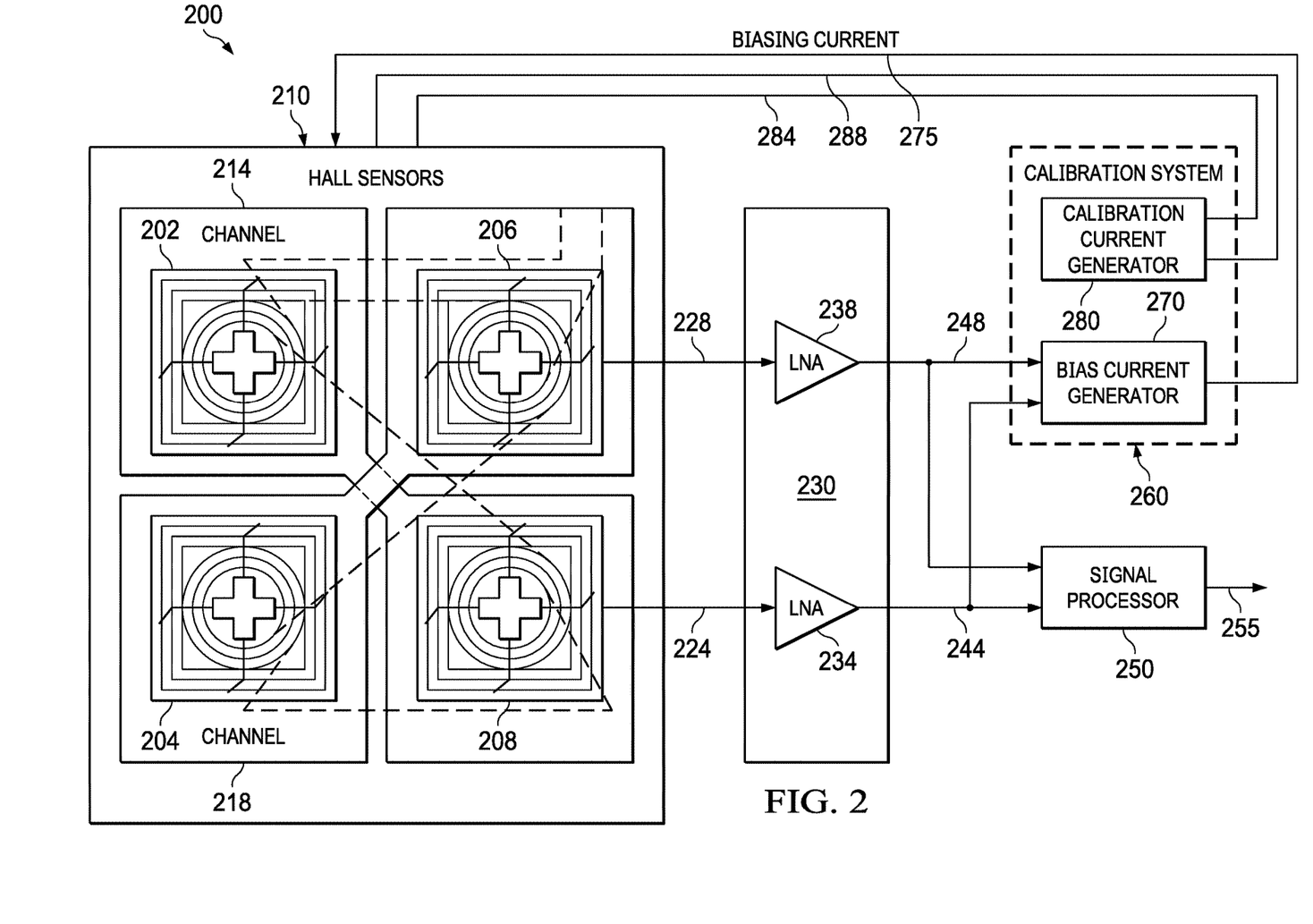
FIG. 2 illustrates, in block diagram form, an example closed-loop calibration magnetic sensor system.

FIG. 2 illustrates, in block diagram form, an example closed-loop calibration magnetic sensor system 200 including a set of Hall sensors 210, a set of low noise amplifiers 230, a signal processor 250, and a calibration system 260. The set of Hall sensors 210 includes four Hall sensor devices 202, 204, 206, and 208 arranged in a quad configuration, each of which includes a drift compensation coil placed on top of a Hall sensor. The set of Hall sensor devices 210 are placed within magnetic sensor system 200 such that each Hall sensor device 202-208 responds substantially equally to the magnetic field to be measured, such as above and centered inside the horseshoe-shaped current conductor 150 shown in FIG. 1.

Channel 214 includes Hall sensor device 202 from the upper left quadrant and Hall sensor device 208 from the lower right quadrant coupled together in parallel. Channel 218 includes Hall sensor device 206 from the upper right quadrant and Hall sensor device 204 from the lower left quadrant coupled together in parallel. The winding directions of drift compensation coils in channels 214 and 218 are opposite. For example, channel 214 includes Hall sensor devices with clockwise windings, while channel 218 includes Hall sensor devices with counterclockwise windings. Calibration currents applied to the drift compensation coils in Hall sensor devices 202-208 generate a calibration magnetic field measured by the set of Hall sensor devices as calibration signal Vcal.

In this example, each channel 214 and 218 includes two Hall sensor devices, but in other implementations a channel can include a single Hall sensor device, or any appropriate number of Hall sensor devices. The arrangement of Hall sensor devices in the set of Hall sensor devices 210 and within each channel 214 and 218 reduces offset during sensor spinning and improves matching between the Hall sensors, as will be discussed further herein with reference to operation of magnetic sensor system 200.

Channel 214 outputs signal 224 to amplifier 234 in the set of amplifiers 230, which outputs an amplified signal 244. Channel 218 outputs signal 228 to amplifier 238 in the set of amplifiers 230, which outputs an amplified signal 248. Signal processor 250 receives amplified signals 244 and 248 corresponding to channels 214 and 218, respectively, and removes the calibration signal Vcal to obtain a measured primary signal Vp, which represents the signal from the set of Hall sensors 210 due to a magnetic field generated by current through the current conductor.

Calibration system 260 includes bias current generator 270 and calibration current generator 280. Bias current generator 270 receives amplifiers signals 244 and 248, isolates the calibration signal Vcal, and generates an appropriate biasing current 275 to maintain or adjust the sensitivity of the set of Hall sensors 210. Calibration current generator 280 generates a temperature-insensitive calibration current and provides it to the set of Hall sensors 210 via traces 284 and 288. A first current path for the calibration current starts at trace 284 and ends at trace 288, and a second current path for the calibration current starts at trace 288 and ends at trace 284. The calibration current is applied to the drift compensation coils in Hall sensor devices 202-208 and causes the Hall sensors to measure the calibration signal Vcal as well as the measured primary signal Vp. The calibration signal Vcal and the measured primary signal Vp are combined linearly.

As discussed previously herein with reference to channels 214 and 218, the drift compensation coils in channel 214 are wound in the opposite direction as the drift compensation coils in channel 218, causing the calibration signal Vcal from one channel to be added to the measured primary signal Vp and the calibration signal Vcal from the other channel to be subtracted from the measure primary signal Vp. For example, signal 224 output from channel 214 is represented as:

$$\text{Signal } 224 = (Vp - Vcal)(\text{GainH}(214))$$

where GainH(214) represents a gain of Hall sensor devices 202 and 208 in channel 214. Signal 228 output from channel 218 is represented as:

$$\text{Signal } 228 = (Vp + Vcal)(\text{GainH}(218))$$

where GainH(218) represents a gain of Hall sensor devices 204 and 206 in channel 218.

Signal 244 output from amplifier 234 in response to signal 224 from channel 214 is represented as:

$$\text{Signal } 244 = (\text{Signal } 224)(\text{GainA}(234))$$

$$\text{Signal } 244 = (Vp - Vcal)(\text{GainH}(214))(\text{GainA}(234))$$

$$\text{Signal } 244 = (Vp - Vcal)(\text{GainT}(214))$$

where GainA(234) represents a gain of amplifier 234, and GainT(214) represents the total gain for channel 214. Signal 248 output from amplifier 238 in response to signal 228 from channel 218 is represented as:

$$\text{Signal } 248 = (\text{Signal } 228)(\text{GainA}(238))$$

$$\text{Signal } 248 = (Vp + Vcal)(\text{GainH}(218))(\text{GainA}(238))$$

$$\text{Signal } 248 = (Vp + Vcal)(\text{GainT}(218))$$

where GainA(238) represents a gain of amplifier 238, and GainT(218) represents the total gain for channel 218.

Because the measured primary signal Vp and the calibration signal Vcal pass through the same set of Hall sensor devices 210 and the same set of amplifiers 230, both are subject to the same drifts and fluctuations due to environmental and operating conditions, which allows calibration system 260 to more accurately adjust the sensitivity and bias current for the set of Hall sensor devices 210. Hall sensors devices 202-208 and the set of amplifiers 230 are chosen to be substantially matched, such that GainH(214) and GainH(218) are substantially equal, and GainA(234) and GainA(238) are substantially equal. Thus, GainT(214) and GainT(218) are substantially equal, causing the measured primary signal Vp in each of signals 244 and 248 to be substantially the same and in phase.

Signal processor 250 removes the calibration signal Vcal from signals 244 and 248 by summing them together in order to generate primary signal 255, which is represented as:

$$\text{Signal } 255 = \text{Signal } 244 + \text{Signal } 248$$

$$\text{Signal } 255 = (Vp - Vcal)(\text{GainT}(214)) + (Vp + Vcal)(\text{GainT}(218))$$

$$\text{Signal } 255 = Vp(\text{GainT}(214) + \text{GainT}(218)) + Vcal(\text{GainT}(218) - \text{GainT}(214))$$

As this representation illustrates, the measured primary signal Vp is a common mode signal while the calibration signal Vcal is a differential signal, which ensures that Vp and Vcal are orthogonal signals and do not interfere with each other. Where GainT(214) and GainT(218) are substantially the same because the set of Hall sensors 210 and the set of amplifiers 230 are substantially matched, the calibration signal Vcal is cancelled out, causing primary signal 255 to be represented as:

$$\text{Signal } 255 = Vp(2\text{GainT})$$

Signal processor 250 then performs any further calculations or other signal processing on primary signal 255 before outputting it to other circuits on the semiconductor device.

Bias current generator 270 is configured to determine a reference signal Vref by isolating the calibration signal Vcal from signals 244 and 248, and to adjust biasing current 275 accordingly. Because the calibration signal Vcal in signals 244 and 248 is differential, bias current generator 280 can isolate it by subtracting the two signals:

$$Vref = \text{Signal } 248 - \text{Signal } 244$$

$$Vref = (Vp + Vcal)(\text{GainT}(218)) - (Vp - Vcal)(\text{GainT}(214))$$

$$Vref = Vp(\text{GainT}(218) - \text{GainT}(214)) + Vcal(\text{GainT}(218) + \text{GainT}(214))$$

Where GainT(214) and GainT(218) are substantially the same because the set of Hall sensors 210 and the set of amplifiers 230 are substantially matched, the measured primary signal Vp is cancelled out, causing Vref to be represented as:

$$Vref = Vcal(2\text{GainT})$$

Mismatch in Hall sensor devices 202-208 or amplifiers 234 and 238 results in unequal GainT(214) and GainT(218), which introduces an error term into primary signal 255 and Vref. Calibration current generator 280 can be configured to chop the calibration current and provide the calibration current to the set of Hall sensors 210 via the first current path, starting at trace 284 and ending at trace 288, or the second current path, starting at trace 288 and ending at trace 284, to reduce a difference between GainT(214) and GainT (218). Un-chopping and averaging the chopped calibration signal Vcal modulates the error terms in primary signal 255 and Vref into variable AC ripple, preventing the mismatch from contributing DC error.

For primary signal 255, the calibration signal Vcal is much smaller than the measured primary signal Vp, which reduces the error term below a noise threshold of magnetic sensor system 200. For Vref, in contrast, the error term can be larger than the calibration signal Vcal because the measured primary signal Vp is much larger than Vcal. In some implementations, bias current generator 270 filters Vref before adjusting biasing current 275 to account for the larger error term from the measured primary signal Vp.

Figure 3:
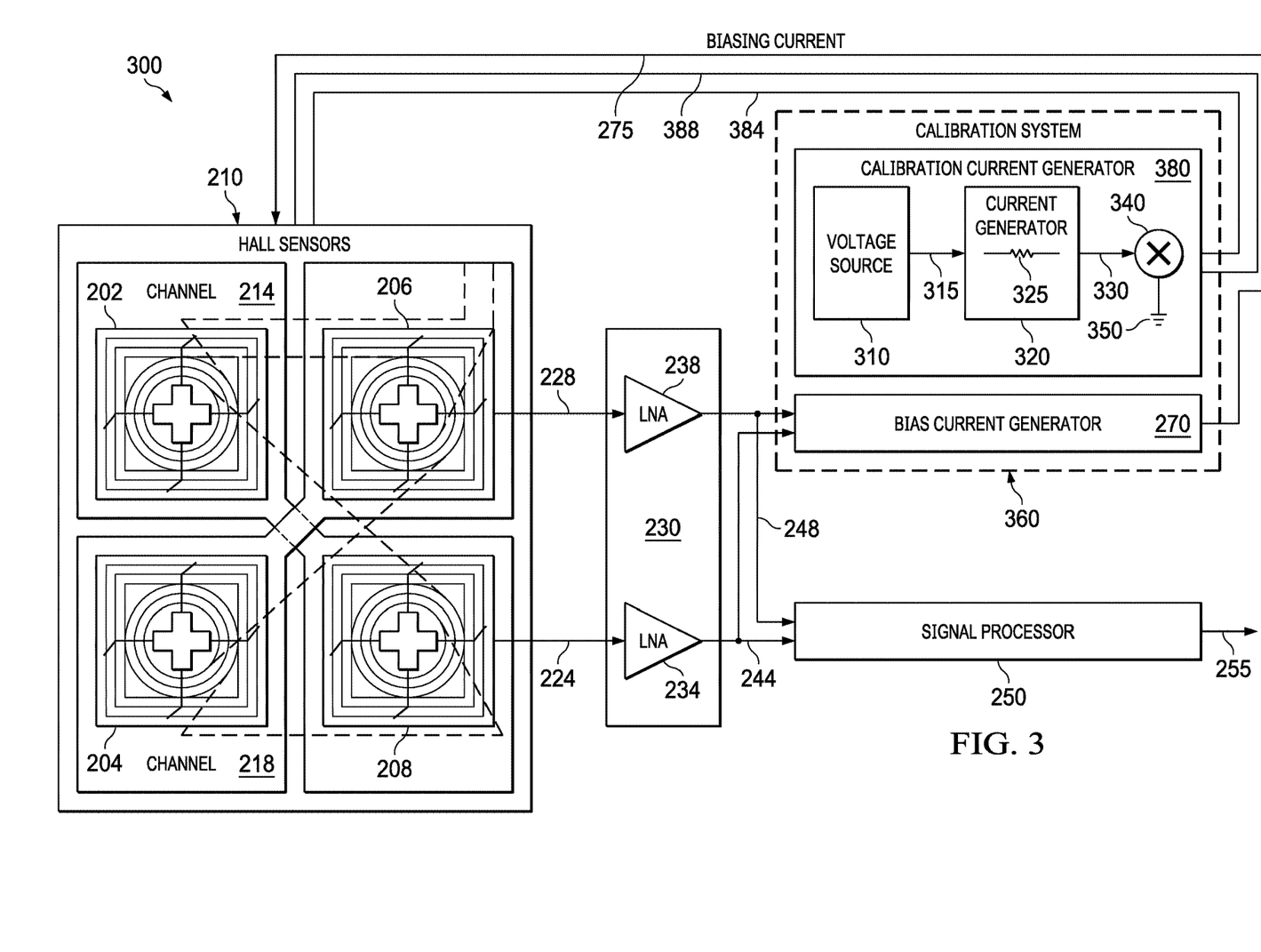
FIG. 3 illustrates, in block diagram form, an example calibration current generator for a calibration system in a closed-loop calibration magnetic sensor system.

FIG. 3 illustrates, in block diagram form, an example calibration current generator 380 for a calibration system 360, which can be included in a closed-loop calibration magnetic sensor system 300 similar to system 200 shown in FIG. 2. For ease of explanation, calibration current generator 380 is described herein with reference to magnetic sensor system 200 shown in FIG. 2. Calibration current generator 380 is configured to generate a temperature-insensitive calibration current 330, which is applied to the drift compensation coils in Hall sensor devices 202-208 via traces 384 and 388. A first current path for calibration current 330 starts at trace 384 and ends at trace 388, and a second current path for calibration current 330 starts at trace 388 and ends at trace 384. Calibration current 330 causes the Hall sensors to measure the calibration signal Vcal as well as the measured primary signal Vp.

Calibration current generator 380 includes a voltage source 310, a current generator 320, and a chopper circuit 340. Voltage source 310 can be a bandgap voltage reference circuit that is substantially temperature independent and provides a reference voltage 315 to current generator 320. Current generator 320 comprises a resistor 325 with a low temperature coefficient, such as a silicon chromium (SiCr) resistor, and generates calibration current 330 based on reference voltage 315 from voltage source 310. Chopper circuit 340 receives calibration current 330 and a common mode voltage 350, and outputs calibration current 330 to the set of Hall sensors 210 via traces 384 and 388, alternating between the first and the second current paths at an appropriate frequency.

Figure 4:
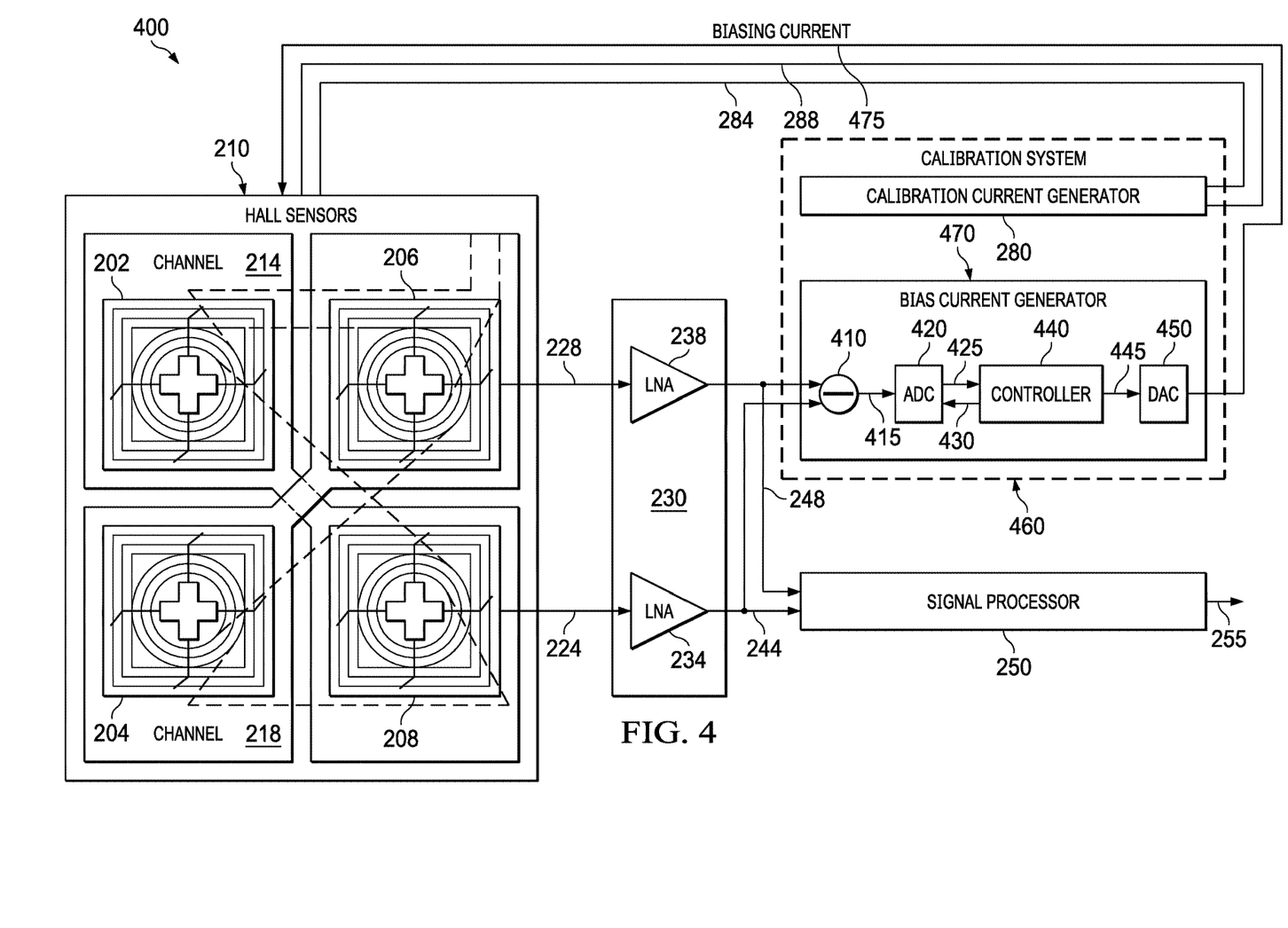
FIG. 4 illustrates, in block diagram form, an example bias current generator for a calibration system in a closed-loop calibration magnetic sensor system.

FIG. 4 illustrates, in block diagram form, an example bias current generator 470 in a calibration system 460, which can be included in a closed-loop calibration magnetic sensor system 400 similar to system 200 shown in FIG. 2. For ease of explanation, bias current generator 470 is described herein with reference to magnetic sensor system 200 shown in FIG. 2. Bias current generator 470 receives amplifier signals 244 and 248, isolates the calibration signal Vcal, and generates an appropriate biasing current 475 to maintain or adjust the sensitivity of the set of Hall sensors 210. Bias generator 470 includes a subtractor 410, an ADC 420, a controller 440, and a DAC 450. In this example, controller 440 is included in bias generator 470, but in other implementations, controller 440 is part of magnetic sensor system 400 and not included in bias generator 470 specifically.

Subtractor 410 receives signals 244 and 248 and subtracts them, as discussed previously herein with reference to FIG. 2. The resulting reference signal Vref 415 is provided to ADC 420, which samples it and provides the sampled data to controller 440. In some examples, ADC 420 integrates Vref 415 over a period of time, and controller 440 averages the sampled value 425 with a number of prior sampled values, to filter noise from the set of Hall sensors 210 and error from the primary signal introduced by a mismatch in GainT(214) and GainT(218). In this example, ADC 420 integrates Vref 415 over 12.5 milliseconds, and controller 440 averages the sampled value 425 with the 8 prior sampled values, resulting in 10 Herz (Hz) bandwidth filtering. Controller 440 sends a control signal 430 to ADC 420 to control how long ADC 420 integrates Vref 415.

Controller 440 compares the averaged sampled values 425 to a threshold representing the expected sensor output value and desired sensitivity for the set of Hall sensors 210. A difference between the averaged sampled values 425 and the expected sensor output value results from changes in environmental and operating conditions; prompting controller 440 to determine an adjustment to biasing current 475 to compensate for the change in conditions. Controller 440 sends a control signal 445 to DAC 450 based on the comparison and the determined adjustment, causing DAC 450 to generate a biasing current 475 for set of Hall sensors 210.

Figure 5:
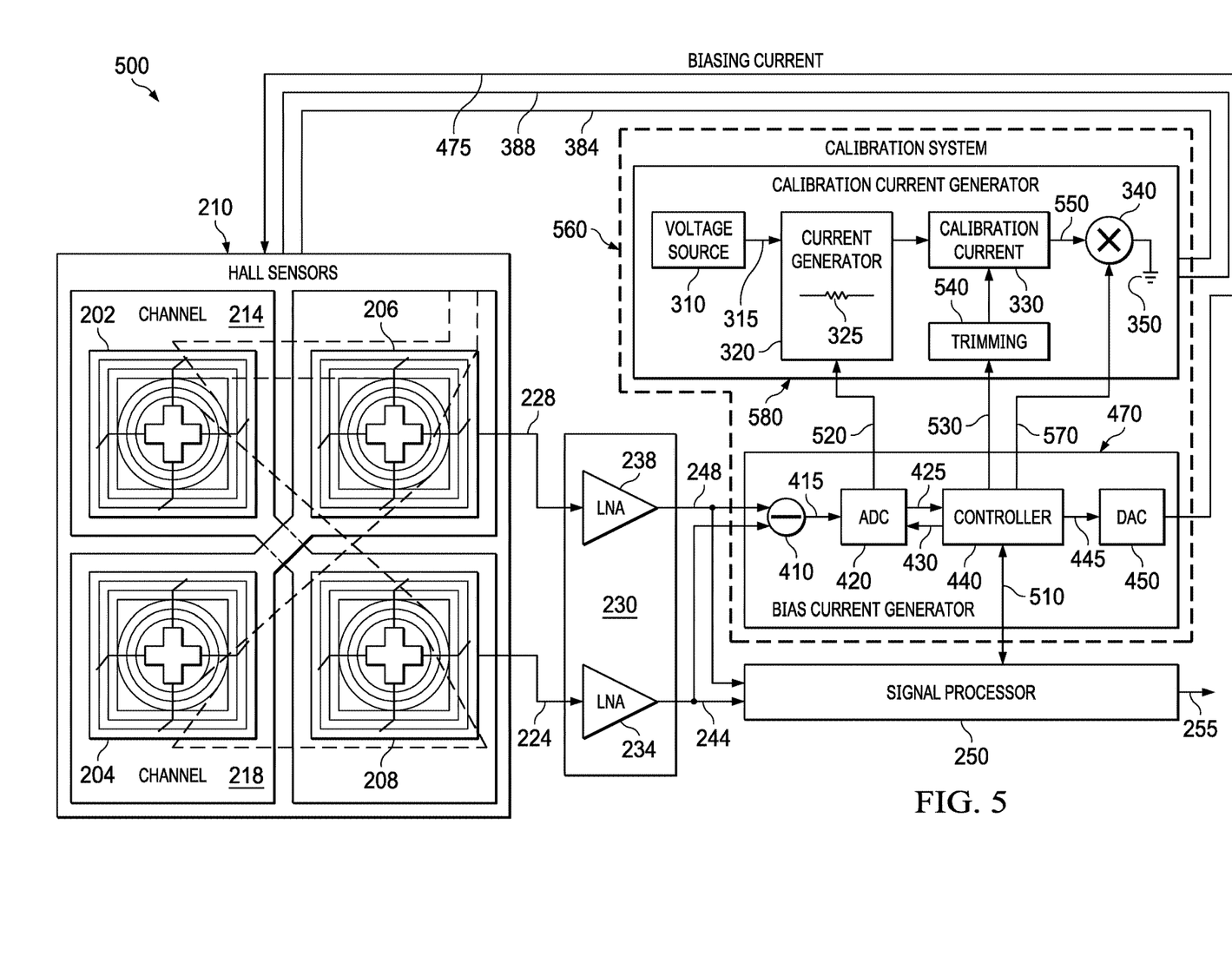
FIG. 5 illustrates, in block diagram form, an example calibration system including a calibration current generator based on the one shown in FIG. 3 and the bias current generator shown in FIG. 4, for a closed-loop calibration magnetic sensor system.

FIG. 5 illustrates, in block diagram form, an example calibration system 560 including a calibration current generator 580 based on calibration current generator 380 shown in FIG. 3 and the bias current generator 470 shown in FIG. 4, showing the interactions between components in each. For ease of explanation, calibration system 560 is described herein with reference to closed-loop calibration magnetic sensor system 200 shown in FIG. 2, calibration current generator 380 shown in FIG. 3, and bias current generator 470 shown in FIG. 4. Controller 440 is included in bias generator 470 in this example, but in other implementations, controller 440 is part of magnetic sensor system 500 and not included in bias generator 470 specifically. Controller 440 and signal processor 250 communicate via signals 510. Controller 440 can provide alerts to signal processor 250 regarding drifts in sensitivity in set of Hall sensors 210 and changes in environmental and operating conditions.

Calibration current 330 and a reference voltage 520 for ADC 420 are tightly coupled to ensure that any changes in reference voltage 315 from voltage source 310 are reflected in ADC 420 as well. If reference voltage 315 changes while a reference voltage 520 for ADC 420 remains constant, Vref 415 changes due to the change in reference voltage 315, not because of a change in environmental or operating conditions. Sampled values 425 from ADC 420 change as well, and are no longer reflective of changes in sensitivity of the set of Hall sensors 210. To ensure calibration current 330 and the reference voltage 520 for ADC 420 are tightly coupled, ADC reference voltage 520 is taken across resistor 325 in current generator 320. The temperature coefficient of resistor 325 is the limiting factor in the drift accuracy of calibration system 560.

In this example, calibration current generator 580 also includes a trimming circuit 540, which trims calibration current 330 from current generator 320 to account for device differences. Controller 440 provides a control signal 530 to trimming circuit 540, indicating trimming circuit 540 is to trim calibration current 330. Chopper circuit 340 receives trimmed calibration current 550 and a common mode voltage 350, and outputs trimmed calibration current 550 via traces 384 and 388, alternating between the first and the second current paths at an appropriate frequency.

Controller 440 also provides a clock signal 570 to chopper circuit 340. In some examples, clock signal 570 indicates a chopping frequency for chopper circuit 340 to alternate between the first and the second current paths. Because the measured primary signal Vp is common mode and the calibration signal Vcal is differential, controller 440 can chop the set of Halls sensors 210, the set of amplifiers 230, and calibration current 330 independently, each being chopped at an independent, appropriate frequency to reduce channel interactions and error from gain mismatch.

Figure 6:
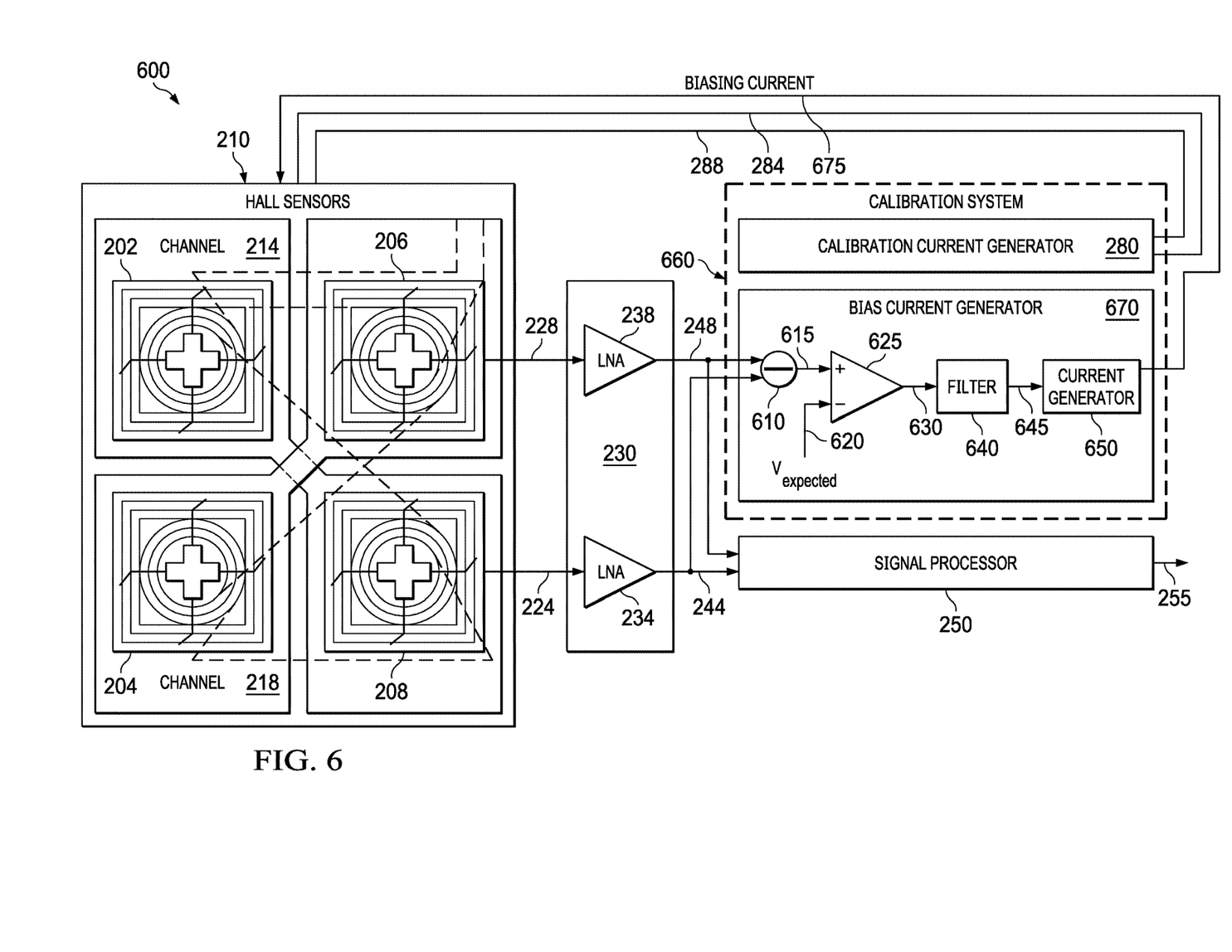
FIG. 6 illustrates, in block diagram form, an example analog bias current generator for a calibration system in a closed-loop calibration magnetic sensor system.

FIG. 6 illustrates, in block diagram form, an example analog bias current generator 670 in calibration system 660, which can be included in a closed-loop calibration magnetic sensor system 600 similar to magnetic sensor system 200 shown in FIG. 2. For ease of explanation, bias current generator 670 is described herein with reference to magnetic sensor system 200 shown in FIG. 2. Bias current generator 670 receives amplifier signals 244 and 248, isolates the calibration signal Vcal, and generates an appropriate biasing current 675 to maintain or adjust the sensitivity of the set of Hall sensors 210. Bias current generator 670 includes a subtractor 610, a differential amplifier 625, a filter 640, and a current generator 650.

Subtractor 610 receives signals 244 and 248 and subtracts them, as discussed previously herein with reference to FIG. 2. The resulting reference signal Vref 615 is provided to a positive input terminal of differential amplifier 625. A negative input terminal of differential amplifier 625 receives an expected voltage Vexp 620 representing the expected voltage from the set of Hall sensors 210 in response to calibration currents 284 and 288. The difference 630 between Vref 615 and Vexp 620 results from a change in environmental and operating conditions, and is provided to filter 640, which filters noise from the set of Hall sensors 210 and error from the primary signal introduced by a mismatch in GainT(214) and GainT(218). The filtered difference signal 645 is provided to current generator 650, which maintains or adjusts a value of biasing current 675 generated by it.

Figure 7:
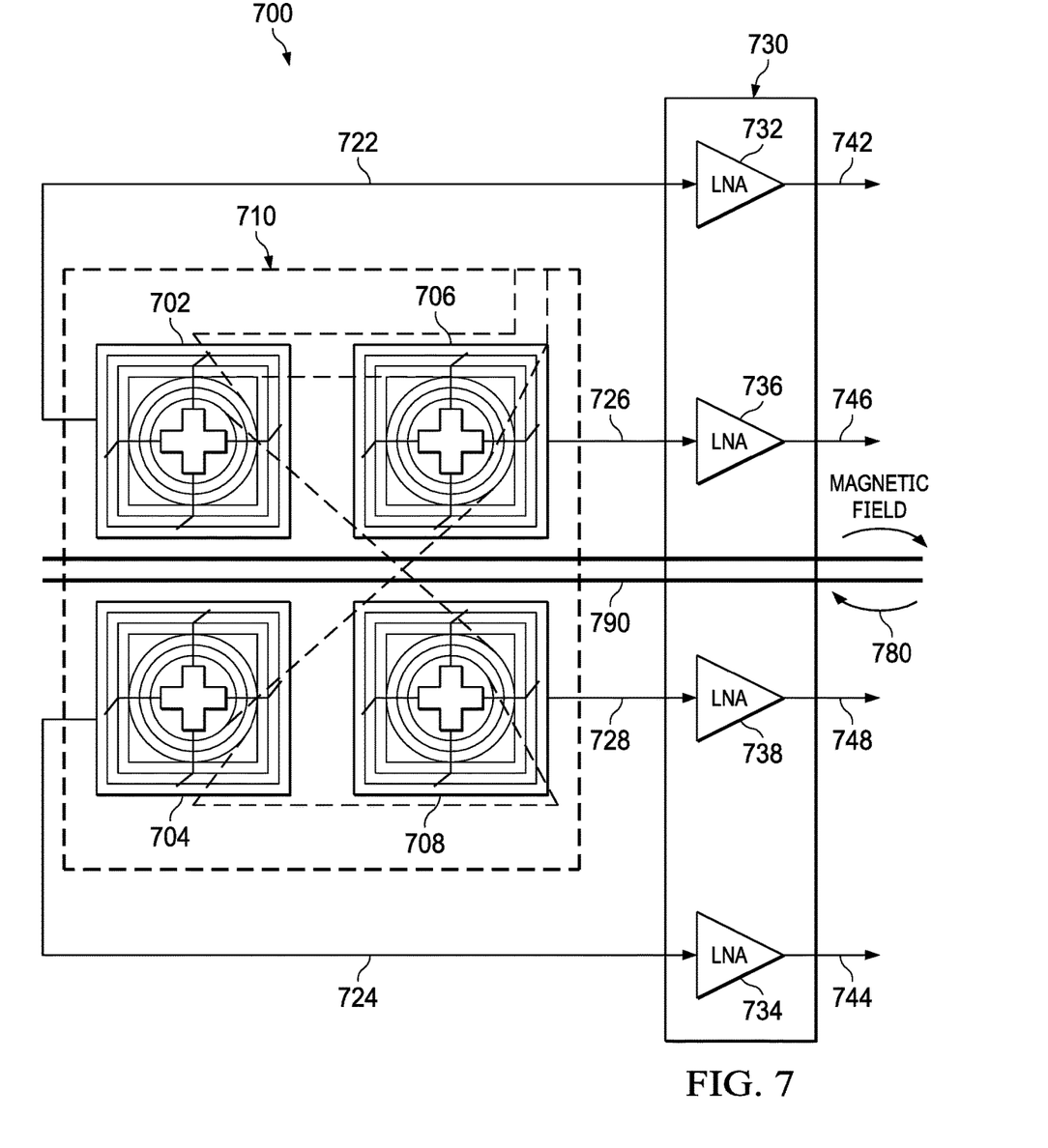
FIG. 7 illustrates another example arrangement for a closed-loop calibration magnetic sensor system in line with a current conductor.

FIG. 7 illustrates another example arrangement for a closed-loop calibration magnetic sensor system 700 in line with a current conductor 790. FIG. 7 shows a set of Hall sensors 710 and a set of low noise amplifiers 730 included in magnetic sensor system 700. The set of Hall sensors 710 and the set of amplifiers 730 are similar to the set of Hall sensors 210 and the set of amplifiers 230 shown in FIG. 2, except that the set of Hall sensors 710 are arranged on either side of current conductor 790, rather than on one side of current conductor 150 shown in FIG. 1. Hall sensor devices 702 and 706 are placed on one side of current conductor 790, and Hall sensor devices 704 and 708 are placed on the opposite side of current conductor 790.

The set of Hall sensor devices 710 are placed within magnetic sensor system 700 such that each Hall sensor device 702-708 responds substantially equally to an ambient magnetic field, but responds with opposite polarities to the magnetic field 780 to be measured from current conductor 790, causing the measured primary signal Vp to be differential mode while the calibration signal Vcal is common mode. Vp and Vcal are orthogonal signals and do not interfere with each other, substantially the same as in FIG. 2.

In magnetic sensor system 700, each of Hall sensors 702, 704, 706, and 708 comprise a separate Hall channel, such that magnetic sensor system 700 includes four unique Hall channels. The ambient magnetic field has the same magnitude and polarity across the set of Hall sensors 710 while the magnetic field 780 has the opposite polarity on either side of current conductor 790. By extending the architecture to four separate Hall channels, magnetic sensor system 700 can leverage the relative polarities of the ambient magnetic field and the magnetic field 780 to measure the primary signal, negate the ambient magnetic field, and calibrate the biasing current for the Hall channels to adapt the sensitivity of the set of Hall sensors 710 in response to drift due to changes in environmental and operating conditions.

The primary signal Vp is isolated by subtracting the signals from the Hall channels on one side of current conductor 790 from the signals from the Hall channels on the other side of current conductor 790:

$4Vp$=(Signal 742+Signal 746)−(Signal 744+Signal 748)

The ambient signal Vamb is isolated by adding together the signals from the Hall channels on both sides of current conductor 790:

$4Vamb$=Signal 742+Signal 744+Signal 746+Signal 748

The calibration signal Vcal is isolated by combining signals from opposite Hall channels and finding the difference, as described herein with reference to FIG. 2:

$4Vcal$=(Signal 742+Signal 748)−(Signal 744+Signal 746)

In this description, the term "couple" or "couples" means either an indirect or direct wired or wireless connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Unless otherwise stated, in this description, "the same" or "substantially" or "largely" the same means the two are within ten percent of each other, "substantially" or "largely" unaffected or constant means less than a ten percent change, and "substantially" all means ninety percent or more.

Modifications are possible in the described embodiments, and other embodiments are possible, within the scope of the claims.

What is claimed is:

1. A system, comprising:
a calibration current generator configured to provide a calibration current to a first Hall channel and a second Hall channel; and
a bias current generator configured to:
obtain a calibration signal from the first and the second Hall channels;
determine a difference between the calibration signal and a threshold; and
adjust a biasing current for the first and the second Hall channels based on the difference,
wherein the calibration signal comprises a first calibration signal corresponding to the first Hall channel and a second calibration signal corresponding to the second Hall channel, and wherein the system further comprises:
the first Hall channel coupled to a first amplifier, wherein the first amplifier is configured to output the first calibration signal;
the second Hall channel coupled to a second amplifier, wherein the second amplifier is configured to output the second calibration signal; and wherein the first Hall channel comprises a first Hall device having a first drift compensation coil with a first winding direction on top of a first Hall sensor;
the second Hall channel comprises a second Hall device having a second drift compensation coil with a second winding direction on top of a second Hall sensor; and
the first winding direction is opposite from the second winding direction.

2. The system of claim 1, wherein the calibration current generator comprises:
a voltage source configured to provide a reference voltage;
a current generator coupled to the voltage source and configured to generate the calibration current; and
a chopper circuit coupled to the current generator and configured to provide the calibration current to the first and the second Hall channels via a first current path or a second current path.

3. The system of claim 2, wherein the voltage source comprises a bandgap voltage reference circuit.

4. The system of claim 2, wherein the current generator comprises a resistor.

5. The system of claim 4, wherein the bias current generator comprises:
a subtractor circuit configured to:
obtain a first signal from the first Hall channel and a second signal from the second Hall channel; and
subtract the first signal from the second signal to obtain the calibration signal;
an analog-to-digital converter (ADC) coupled to the subtractor circuit and configured to sample the calibration signal to obtain a sampled signal;
a controller coupled to the ADC and configured to:
determine the difference between the sampled signal and the threshold;
determine an adjustment to the biasing current based on the difference; and
generate a control signal based on the determined adjustment;
a digital-to-analog converter (DAC) coupled to the controller and configured to adjust the biasing current based on the control signal.

6. The system of claim 5, wherein the ADC is further configured to integrate the calibration signal over a period of time to obtain the sampled signal.

7. The system of claim 6, wherein the controller is further configured to average the sampled signal with a number of prior sampled signals to obtain an averaged signal, and wherein the controller is configured to determine the difference between the averaged signal and the threshold.

8. The system of claim 5, wherein an ADC reference voltage is taken across the resistor.

9. The system of claim 5, wherein the controller is further configured to provide a clock signal to the chopper circuit, and wherein the chopper circuit is further configured to alternate between the first current path and the second current path based on the clock signal.

10. The system of claim 5, wherein the calibration current generator further comprises a trimming circuit configured to trim the calibration current.

11. The system of claim 1, wherein a gain of the first Hall channel and a gain of the second Hall channel are substantially equal, and wherein a gain of the first amplifier and a gain of the second amplifier are substantially equal.

12. The system of claim 1, wherein the first and the second Hall channels are oriented such that the first and the second Hall channels are configured to respond substantially the same to a magnetic field.

13. A system, comprising:
a first Hall channel coupled to a first amplifier, wherein the first Hall channel comprises a first Hall device having a first drift compensation coil with a first winding direction on top of a first Hall sensor;
a second Hall channel coupled to a second amplifier, wherein the second Hall channel comprises a second Hall device having a second drift compensation coil with a second winding direction on top of a second Hall sensor, wherein the second winding direction is opposite the first winding direction; and
a calibration system, comprising:
a bias current generator coupled to the first and the second amplifiers and to the first and the second Hall channels, wherein the bias current generator is configured to generate a biasing current for the first and the second Hall channels; and
a calibration current generator coupled to the first and the second Hall channels, wherein the calibration current generator is configured to generate a calibration current for the first and the second Hall channels.

14. The system of claim 13, wherein the first and the second Hall devices are matched.

15. The system of claim 13, wherein a gain of the first Hall channel and a gain of the second Hall channel are substantially equal, and wherein a gain of the first amplifier and a gain of the second amplifier are substantially equal.

16. The system of claim 13, wherein the first and the second Hall channels are oriented such that the first and the second Hall channels are configured to respond substantially the same to a magnetic field.

17. The system of claim 13, wherein the bias current generator comprises:
a subtractor circuit coupled to the first and the second amplifiers;
an analog-to-digital converter (ADC) coupled to the subtractor circuit;
a controller coupled to the ADC; and
a digital-to-analog converter (DAC) coupled to the controller and configured to generate the biasing current.

18. The system of claim 13, wherein the bias current generator comprises:
a subtractor circuit coupled to the first and the second amplifiers;
a differential amplifier having a positive input terminal coupled to the subtractor circuit and a negative input terminal configured to receive a threshold;
a filter coupled to the differential amplifier; and
a current generator coupled to the filter.

19. The system of claim 13, wherein the calibration current generator comprises:
a voltage source;
a resistor coupled to the voltage source; and
a chopper circuit coupled to the resistor.

20. The system of claim 19, wherein the voltage source comprises a bandgap voltage reference circuit.

21. The system of claim 13, wherein:
the first Hall channel further comprises a third Hall device coupled in parallel with the first Hall device, the third Hall device comprising a third drift compensation coil with the first winding direction on top of a third Hall sensor; and the second Hall channel further comprises a fourth Hall device coupled in parallel with the second Hall device, the fourth Hall device comprising a fourth drift compensation coil with the second winding direction on top of a fourth Hall sensor.

22. The system of claim 21, wherein the first, the second, the third, and the fourth Hall devices are arranged in a quad configuration, such that:
the first Hall device comprises a top left quadrant;
the second Hall device comprises a top right quadrant;
the third Hall device comprises a bottom right quadrant; and
the fourth Hall device comprises a bottom left quadrant.

\* \* \* \* \*